United States Patent [19]

Masuda

[11] 3,789,311

[45] Jan. 29, 1974

[54] HALL EFFECT DEVICE

[75] Inventor: Noboru Masuda, Kawaguchi, Japan

[73] Assignee: Denki Onkyo Co., Ltd., Tokyo, Japan

[22] Filed: Sept. 13, 1971

[21] Appl. No.: 180,029

[52] U.S. Cl. .................... 330/6, 338/32 H, 307/309

[51] Int. Cl. ............................................ H03f 15/00

[58] Field of Search ........ 330/6; 307/309; 338/32 H

[56] References Cited

UNITED STATES PATENTS

| | | | |
|---|---|---|---|
| 3,296,573 | 1/1967 | Heid et al. | 338/32 H |
| 3,082,507 | 3/1963 | Kuhrt et al. | 338/32 H X |
| 3,162,932 | 12/1964 | Wood et al. | 338/32 H X |

*Primary Examiner*—Nathan Kaufman

*Attorney, Agent, or Firm*—Armstrong & Wegner

[57] ABSTRACT

A Hall effect device provided with input terminal sections at both ends and output terminal sections, which are projected, at both sides of the center wherein at least one through hole is provided at a position near the side edge of at least one terminal section and is opened by cutting the side edge of the device so as to adjust unbalanced voltage.

8 Claims, 18 Drawing Figures

HALL EFFECT DEVICE

BACKGROUND OF THE INVENTION

In case of conventional Hall effect devices (hereinafter referred to as the "device"), the unbalanced voltage has occurred due to the following reasons.

Firstly, unbalanced voltage resulting from geometrical unbalance of the terminal section of the device:

This unbalanced voltage arises from an improper position of lead wires which are fixed to the terminal sections or misalignment of a mask when making a device by means of a photo-etching method or uneven workmanship in side etching.

The unbalanced voltage occurs because center lines *a* and *a'* of output terminals *o* and *o'* of a device as complete product does not match specified center line A of the device and, the apparent resistance value between input terminal I at the current supply side (high potential side) and center *a* of the other terminal section is small and that between terminal I and center *a'* of the other terminal section is large.

In this case, the unbalanced voltage occurs becausea potential arises across output terminals *o* and *o'*.

Secondly, unbalanced voltage resulting from uneven thickness of a device;

This unbalanced voltage arises from unevenness of the thickness of internal resistor of the device.

Thirdly, unbalanced voltage resulting from crystalline strain in the device:

Fourthly, unbalanced voltage resulting from uneven existence of impurity in the device;

The crystalline strain which is a cause of unbalanced voltage described in the third paragraph may be caused by a heat to be applied to the device when bonding lead wires to the terminal sections (a fusible metal is used as the bond).

Since said unbalanced voltage occurs across output terminals when no magnetic field exists, it is undesirable depending on the purpose of the device in use. To eliminate this unbalanced voltage, it has been tried to form an increased resistance portion by cutting off a part of the side of the device, as shown in FIG. 18, between the output terminal section and the input terminal section at which the potential is high and to adjust unbalance of the current density.

However, the method described above is disadvantageous bacause mechanical strain occurs in the device due to direct cutting off of the device, thus deteriorating symmetricity of the output characteristic with respect to application of positive and negative magnetic field or because the unbalanced voltage of small current cannot be completely eliminated or the linearity of the output characteristic deteriorates. Furthermore, it is disadvantageous because the device is damaged during processing and loss of products is therefore great.

The present invention provides a Hall effect device wich can eliminate such disadvantages as described above.

SUMMARY

A Hall effect device wherein a pair of input terminal sections are provided at both ends and a pair of output terminal sections, which projects from the device in the direction of a right angle is provided at the both sides of the center portion, at least one through hole is provided so that at least one of said input and output terminal sections may be located near the side edge of the terminal section and the through hole is positioned at a location which is not blocked by a lead wire attached to said terminal, that is, in the path of the current flow between the input and output terminals of the device.

BRIEF DESCRIPTION OF THE DRAWINGS

The present invention is illustrated in detail in the accompanying drawings whereof.

DETAILED DESCRIPTION

Figure 1:
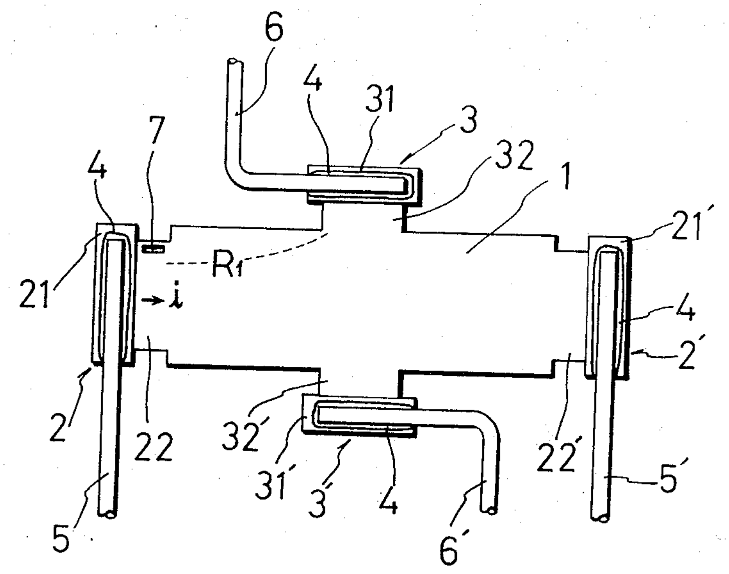
FIGS. 1 to 14 are the plan views illustrating a Hall effect device according to the present invention.

Referring to FIG. 1, there is shown a Hall effect device which is provided with input terminal sections 2 and 2' at both ends of the main part 1 forming magneto-sensing surfaces and projected output terminal sections 3 and 3' at both sides of the center of main part 1.

Said four terminal sections are provided respectively with conductive metals which are metalized and thus input electrodes 21 and 21' and output electrodes 31 and 31' are formed.

Said electrodes are formed at the external end portions of the terminals other than bases 22, 22', 32 and 32' coupled to main part 1 of the device and not at the entire surfaces of the terminals.

Input electrodes 21 and 21' are made of a metal which will come in ohmic contact with the semiconductor material of a Hall effect device such as, for example, In, InTe, etc., if the device is made of InSb.

To these electrodes are connected input lead wires 5 and 5' by using conductive bonding agent 4 such as solder or by directly welding the lead wires with heat. Current *i* of the power supply is supplied to the main part 1 through this lead wire.

On the other hand, output lead wires 6 and 6' are similarly connected to output electrodes 31 and 31' which employ a metal which will be an ohmic contact or a non-ohmic metal. A load is connected to the device through these lead wires.

AT least one through hole 7 is provided at the input terminal section of four terminal sections so that the hole is positioned near the side edge of the terminal section.

It is desirable to form the through hole so that it is thin and long in the direction of the current flow as shown; however, it can be formed in other shape such as, for example, a right square.

In this embodiment, since through hole 7 is only one, it is effective only when the resistance value of path R of current flow between input electrode 21 where through hole 7 is to be provided and output electrode 31 is low, that is, the current density in this path of the current flow is large.

Accordingly, the device of this embodiment is effectively used in the following case.

The device is made by means of a photo-etching method. If a specified pattern for the device may cause an unbalanced. voltage, it is satisfactory to provide a through hole in the path of the current flow between the output electrode and the input electrode at the side where the potential is expected to become high.

Figure 17:
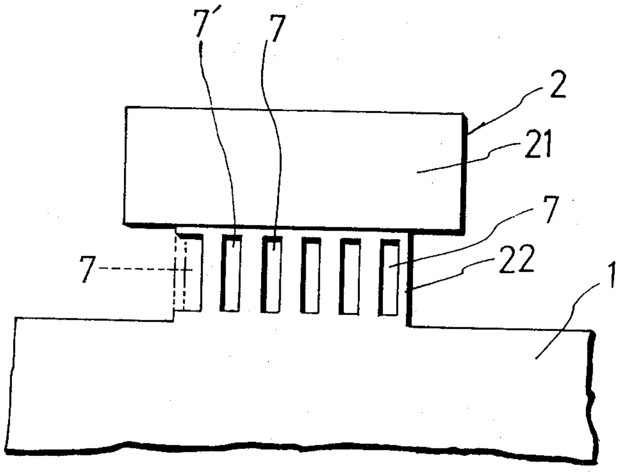

According to this embodiment, after a number of devices made in this pattern are examined to take out the devices only in which the unbalanced voltage occurs, the resistance value of the path of the current flow where the through hole is located can be increased by cutting off part of the side edge of the device as shown in FIG. 17 to open the through hole, thus adjusting the unbalanced voltage.

The device of this embodiment is as described above. Therefore it provides the advantages described below.

The errors in the shape and pattern of the device which will be found in photo-etching in the course of production of devices can be easily corrected.

Because through hole 7 is cut off to open at the side edge, cutting work is easy and the main part of the device can be protected from mechanical strain and damage due to cutting.

However, it is necessary to detect in advance which is the output terminal section at which the potential becomes high; accordingly, this embodiment is inconvenient in the point that the examining process is required before forming the through hole.

Figure 2:
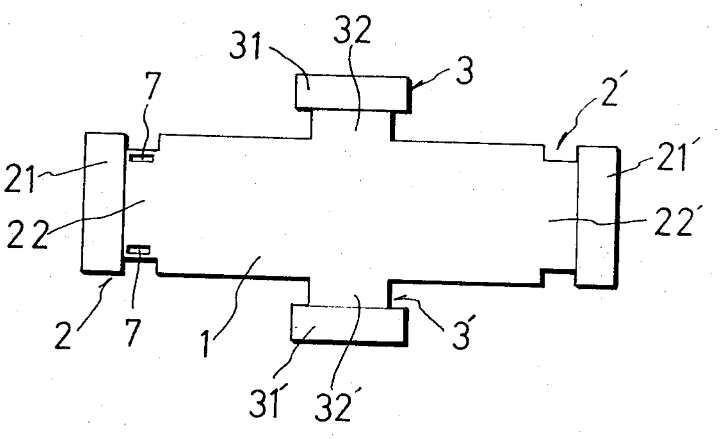

The embodiment shown in FIG. 2 eliminates such inconvenience. According to this embodiment, input terminal section 2 is provided with two through holes 7 near both side edges of the terminal section.

In case of the device according to this embodiment, because the resistance value of the path of the current flow at the side where the cut opened through the hole is located can be increased by opening one of two through holes, it is possible to eliminate the potential difference between both output terminal sections even though the potential becomes high at any one of output terminal sections 3 and 3'.

However, the device according to the embodiment shown in FIG. 2 is provided with two through holes. Even though any one of these two holes is cut to open, the resistance value of the path of the current flow which can be increased is fixed.

Accordingly, if slight unbalanced voltae remains even though a through hole is cut to open, another correcting means is required.

Figure 3:
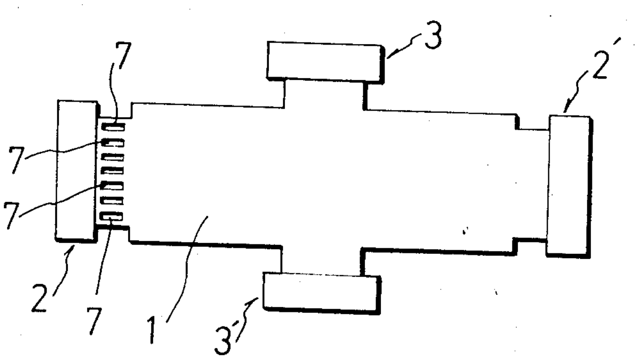

The embodiment shown in FIG. 3 is intended to eliminate the defect as described above. According to this embodiment, input terminal section 2 is provided with a number of through holes 7 arranged in parallel between two through holes shown in FIG. 2.

In case of the device according to this embodiment, the resistance value of the path of the current flow at the side where the cut opened through hole is located can be increased by cutting off the side edge of the terminal from one direction as shown in FIG. 17 as in the case of the embodiment shown in FIG. 2. In case of the device according to this embodiment, if the unbalanced voltage occurs after the external through hole is cut to open, internal through hole 7' adjacent to cut-opened through hole 7 can be cut to open to continue to cut-opened through hole 7 and thus the resistance value of the path of the current flow can be increased step by step.

Figure 15:
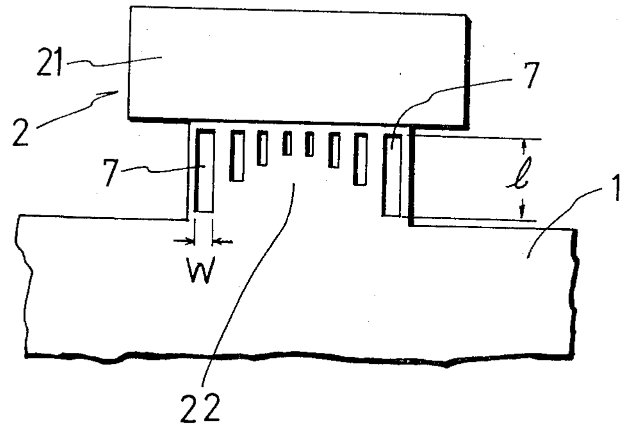
FIGS. 15 to 17 are the magnified plan views illustrating the terminal sections of the device.
Figure 16:
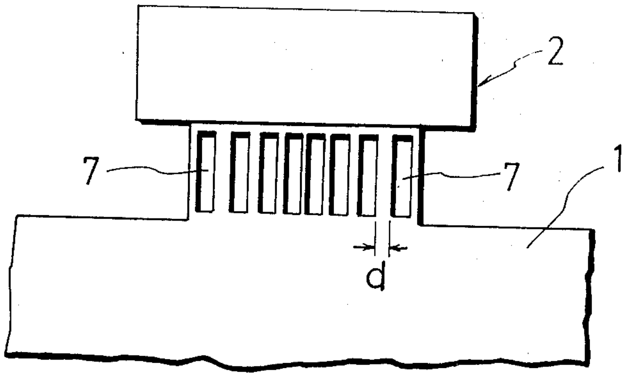

When providing a number of through holes at the terminal section, it is desirable to proivde through holes so that their length $l$ and width $w$ are gradually smaller from the outside to the inside as shown in FIG. 15, thereby variation of the resistance value which will be caused by cutting to continue these through holes in sequence can be small. Thus, this embodiment is advantageous because the resistance value of the path of the current flow can be thus finely adjusted.

In this case, if the through holes are provided so that distance $d$ between the through holes are gradually small, the sectional area of the terminal of the path of current flow which will be cut off also becomes small and therfore, the resistance value can be more finely adjusted.

Figure 4:
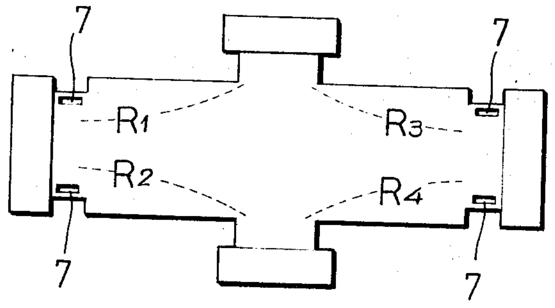
Figure 5:
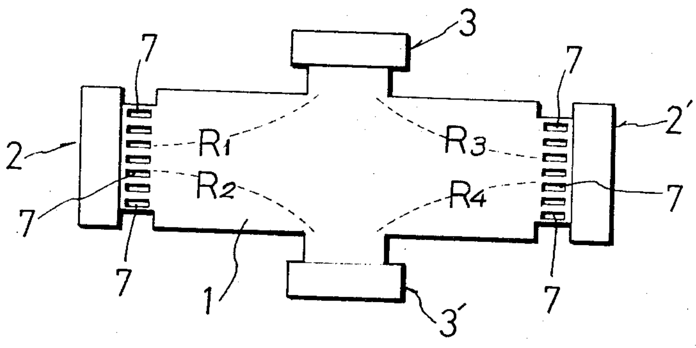

The device according to this invention can fill a desired purpose by forming at least one through hole at at least one of four terminal sections as described above. Depending on the case, through holes 7 can be provided at both input terminal sections as shown in FIG. 4. In this case, it is desirable to provide a number of through holes 7 at the input terminal sections as shown in FIG. 5.

In this embodiment, the device is advantageous because the resistance value of paths R1 and R2 of current flow between input terminal sections 2 and a pair of output terminal sections 3 and 3' can be adjusted and the resistance value of paths R3 and R4 of current flow between output terminal sections 3 and 3' and input terminal section 2' can also be adjusted, thereby the current density in main part 1 of the device can be uniform and the unbalanced potential difference which occurs due to crystalline strain or due to uneven distribution of impurity in the device between output terminal sections 3 and 3' can be effectively eliminated.

Figure 18:
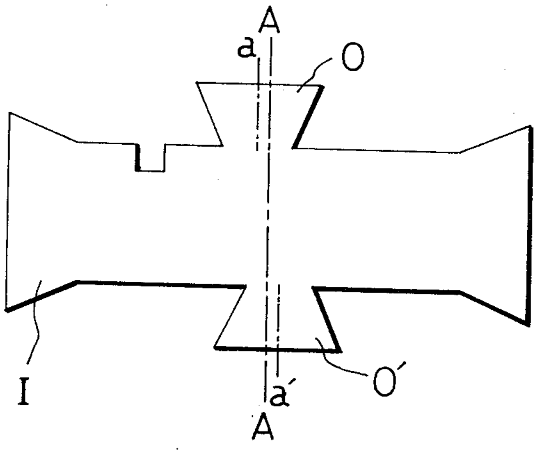
FIG. 18 is the plan view of a conventional device.

Because the unbalanced voltage due to geometrical unbalance of the terminal sections or due to uneven thickness of the device described in the foregoing can be eliminated by making center line $a$ of the terminal section shown in FIG. 18 close to center line A, the unbalanced voltage can be eliminated by cutting off the through hole at the output terminal section to open. However, it is quite difficult to eliminate the unbalanced voltage due to crystalline strain or uneven distribution of impurity in the device by cutting off the through hole at the output terminal, because the unbalanced voltage occurs due to unevenness of the current density in main part 1 of the device. Accordingly, the current density must be adjusted at the input terminal section.

Figure 6:
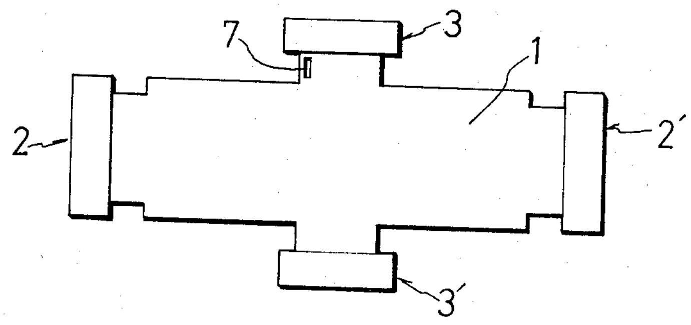
Figure 7:
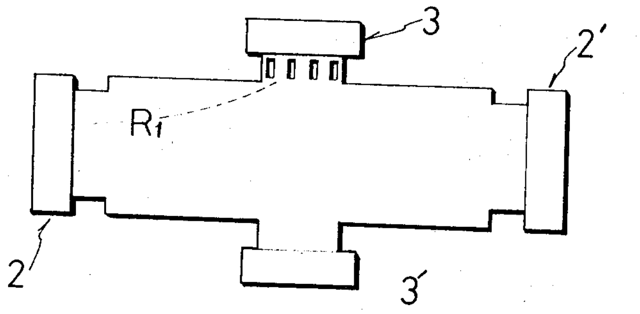
Figure 8:
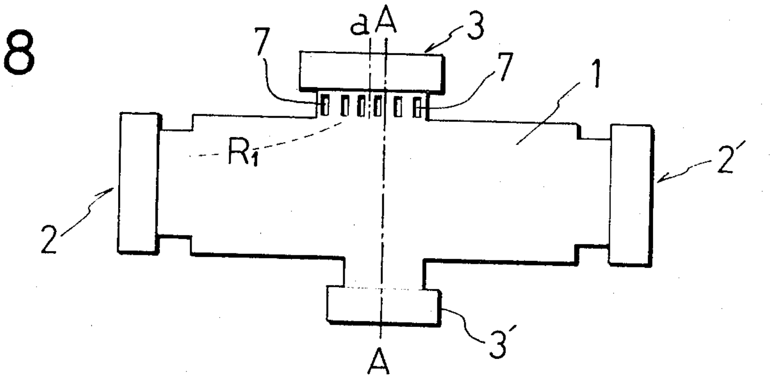

For the reason described above, through hole 7 can be provided at one of the output terminal section as shown in FIGS. 6 to 8, when the unbalanced voltage occurs due to only geometrical unbalance of the terminals.

In this case, the number of through holes can be one as shown in FIG. 6. If so, the resistance value can be adjusted only once; accordingly, it is desirable to provide in parallel a number of through holes 7 as shown in FIG. 7.

Thus, if the through hole or holes are provided at one of the output terminal sections, variation of the resistance value obtained from cutting off to open this through hole arises only in path R1 of current flow between the output terminal section where the through hole is provided and the input terminal section and therefore it is necessary to detect in advance which is the output terminal section in which the potential is high.

Accordingly, in the above embodiment, it is desirabl to make output terminal section 3 wider than desirable terminal section 3' as shown in FIG. 8 so that the unbalanced voltage is artificially produced.

In this case, it is desirable to form wider terminal section 3 so that its center line *a* is positioned near the plus side input terminal and to provide through holes 7 at the side edge portion of the output terminal facing the plus side input terminal.

Figure 9:
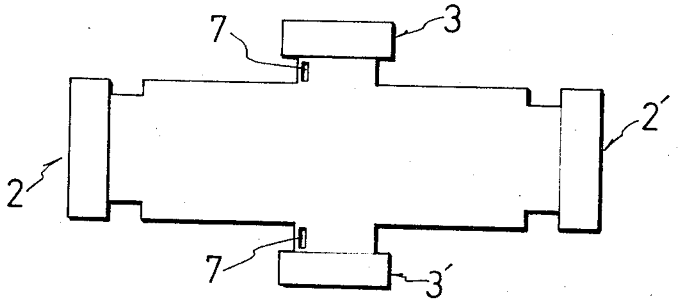
Figure 10:
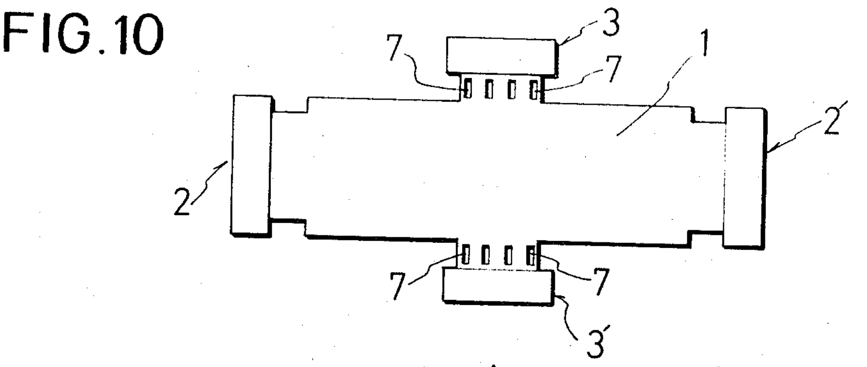

To eliminate disadvantages in the above embodiment, it is desirable to provide through holes 7 at both output terminal sections 3 and 3' as shown in FIGS. 9 and 10.

According to this embodiment, it is easy to adjust the potential even though the potential is high at any one of the output terminal sections; especially in case of the device which is provided with a number of through holes 7 as shown in FIG. 10, the resistance value can be finely adjusted.

Figure 11:
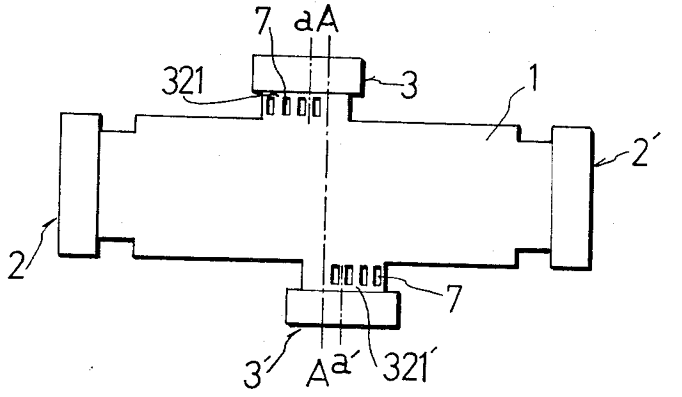

The device in which the through holes are provided at a pair of output terminals can be made as shown in FIG. 11.

In this embodiment, a pair of output terminals 3 and 3' are widely arranged in opposite directions in reference to center line A of the device and each terminal section is provided with the through holes at widely formed terminal surfaces 321 and 321' in reference to center line A.

In this embodiment, adjustment of the resistance value is easy because the pair of output terminals are the references to each other.

In case of the embodiment shown in FIG. 10, it is desirable to deviate center lines of output terminal sections 3 and 3' from center line of the device as in case of FIG. 11. In case of the device which has the output terminal sections provided with a number of through holes, the resistance value of the path of current flow between input terminal section 2 and output terminal section 3 is increased by cutting off through holes 7 to open to the side of the input terminal section 2 (that is, the input terminal section where the potential is high) and making center line *a* of output terminal section 3 close to center line A of the device. If the unbalanced voltage is not eliminated by cutting off the through holes up to the center of output terminal section 3, the unbalanced voltage can be eliminated by cutting off output terminal section 3' at the opposite side from the side of input terminal section 2' at the minus side.

Figure 12:
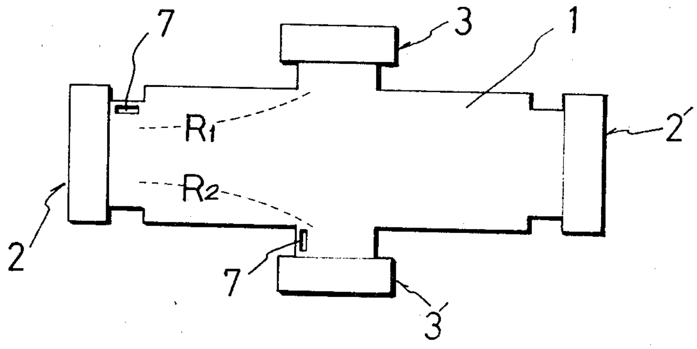

As illustrated in FIG. 12, the device according to the present invention can be provided with a through hole 7 at input terminal section 2 and output terminal section 3' respectively. In this case, it is desirable to arrange through hole 7 respectively in different paths R1 and R2 of current flow.

Figure 13:
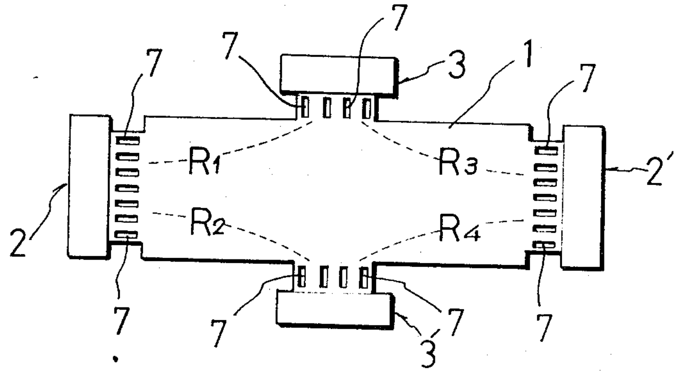

FIG. 13 shows the most desirable embodiment. In this embodiment, all terminal sections 2, 2', 3, and 3' are provided respectively with a number of through holes which are arranged in parallel.

According to this embodiment, the unbalanced voltage can be completely eliminated because the resistance values of four paths R1, R2, R3 and R4 of current flow between two input terminal sections 2 and 2' and output terminal sections 3 and 3'.

Figure 14:
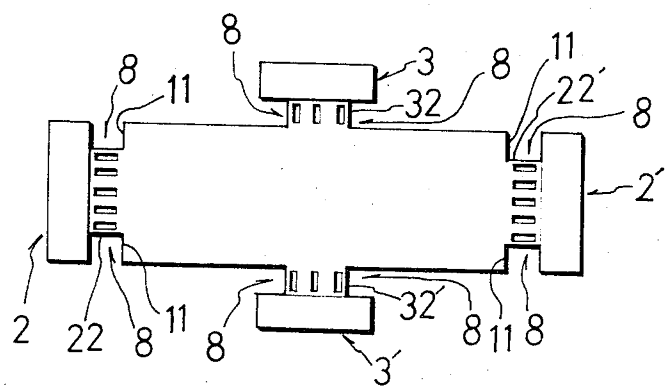

The device described in the above embodiments can provide better output characteristics by being formed as shown in FIG. 14.

In these embodiments, bases 22 and 22' of the input terminal sections and bases 32 and 32' of the output terminal sections are shaped in the form of neck. The neck-shaped bases 22, 22', 32 and 32' are made by cutting off both side edges of the terminal sections in the same size. The cut line 11 of main part 1 of the device which is formed with cut-off space 8 is a straight line.

The device according to the present invention provides the following advantages if it is made as described above.

The output characteristic of the device is improved because the Hall effect can be produced in reference to straight cut line 11.

The unbalanced voltage can be reduced or eliminated because it it easy to accurately coincide the distance between cut line 11 and output terminal sections 3 and 3'.

The unbalanced voltage due to intrusion of the soldering agent or crystalline strain can be preventd because the main part of the device can be protected from intrusion of a conductive soldering agent when soldering the lead wires or from heat when welding the lead wires.

Because the conventional device has not the heat absorbing portion between the terminal sections and the main part of the device, th heat applied to the terminal sections when attaching the lead wire to the terminal section is conducted to the main part of the device and the crystalline arrangement of a semiconductor which forms the device is often disordered. In case of the device according to this embodiment, the cut-off portions at both sides of the neck-shaped base forms a space for heat radiation; accordingly, the heat conducted to the main part of the device can be reduced and disorder in crystalline arrangement of the semiconductor can be effectively prevented.

Because the neck-shaped base is provided between the main part of the device and the electrode, the electrode does not short both sides of the main part of the device, the output voltage between the output terminals can be effectively prevented from lowering. Furthermore, variation of the resistance value at the boundary portion of the electrode can be reduced because the boundary portion of the electrode is small due to the neck-shaped base.

The neck-shapd base, if provided, extremely reduces the influence of heat produced in cutting off the side edge of the device to open the through hole. Therefore, a simple means such as a sand trimmer can be used and the complicated and expensive means such as a leather trimmer is not required. The device is also advantageous in this point.

What is claimed is:

1. A Hall effect device comprising a. a Hall effect member including a central portion having a pair of ends and a pair of sides, a pair of input terminal sections provided at said pair of ends and a pair of output terminal sections provided at said pair of sides, b. a pair of input electrodes connected to said pair of input terminal sections, and c. a pair of output electrodes connected to said pair of output terminal sections, and d. a plurality of through hole means in at least one of said terminal sections, for altering the resistance of the current path betwen at least one of said input terminals and one of said output terminals thereby balancing the voltage of said Hall device, said hole means adjacent but spaced from the connected electrodes, at least one of said hole means being positioned near a side edge of said terminal section.

2. A Hall effect device according to claim 1, wherein two of said hole means are positioned near the side edges of said terminal section and a plurality of said hole means are positioned in parallel between said two hole means.

3. A Hall effect device according to claim 2, wherein the sizes of said hole means are gradually smaller in the sequence from the side edge of the terminal section to the inner part of the terminal.

4. A Hall effect device according to claim 2, wherein the distance between said hole means is gradually narrower in the sequence from the side edge of the terminal section to the inner part of the terminal.

5. A Hall effect device according to claim 1, wherein one of the output terminal section is made wider than the other so that its center line deflects to the one of input terminal sections and at least one hole means is provided thereon.

6. A Hall effect device according to claim 1, wherein thin and long hole means are provided in the direction of current flow.

7. A Hall effect device according to claim 1, wherein the terminal section is cut off at both sides of the section to form a neck shaped base with a straight line formed on the main part of the device.

8. A Hall effect device according to claim 1, wherein the center line of a pair of output terminal sections are shifted in opposite directions with respect to the center line of the device and the plurality of said hole means are positioned in parallel at said output terminal sections on the wider portion thereof with respect to the center line of the device.

* * * * *